United States Patent
Malolepszy et al.

(10) Patent No.: US 7,648,857 B2
(45) Date of Patent: Jan. 19, 2010

(54) PROCESS FOR PRECISION PLACEMENT OF INTEGRATED CIRCUIT OVERCOAT MATERIAL

(75) Inventors: Sean M. Malolepszy, Sherman, TX (US); Rex W. Pirkle, Denison, TX (US)

(73) Assignee: Texas Instruments Incorporated, Dallas, TX (US)

( * ) Notice: Subject to any disclaimer, the term of this patent is extended or adjusted under 35 U.S.C. 154(b) by 163 days.

(21) Appl. No.: 11/464,080

(22) Filed: Aug. 11, 2006

(65) Prior Publication Data

US 2008/0036046 A1    Feb. 14, 2008

(51) Int. Cl.
H01L 21/00 (2006.01)
H01L 23/58 (2006.01)
H01R 43/00 (2006.01)
B05D 5/12 (2006.01)

(52) U.S. Cl. .................. 438/124; 438/112; 438/127; 438/958; 257/632; 257/777; 257/778; 257/E23.116; 257/E23.126; 257/E23.129; 257/E23.132; 257/E21.502; 29/872; 29/885; 427/96.2; 427/552

(58) Field of Classification Search .......... 257/777, 257/632, 788, E23.116, E23.126, E23.129, 257/E23.132, E21.502; 438/112, 124, 127, 438/958; 29/872, 885; 427/96.2, 552
See application file for complete search history.

(56) References Cited

U.S. PATENT DOCUMENTS

| 5,311,426 | A | * | 5/1994 | Donohue et al. ............ 422/102 |
| 5,592,493 | A |   | 1/1997 | Crouch et al. |
| 5,780,348 | A |   | 7/1998 | Lin et al. |
| 6,125,464 | A |   | 9/2000 | Jin |
| 6,440,669 | B1 | * | 8/2002 | Bass et al. ..................... 506/16 |
| 6,836,865 | B2 |   | 12/2004 | Kusko |
| 7,036,060 | B2 |   | 4/2006 | Nakao et al. |
| 2001/0050417 | A1 | * | 12/2001 | Courtenay .................. 257/666 |
| 2002/0061607 | A1 | * | 5/2002 | Akram ....................... 438/118 |
| 2003/0132993 | A1 | * | 7/2003 | Sadasivan et al. ............. 347/85 |
| 2003/0147580 | A1 | * | 8/2003 | Worley ......................... 385/14 |
| 2003/0230799 | A1 | * | 12/2003 | Yee et al. ..................... 257/706 |
| 2006/0211132 | A1 | * | 9/2006 | Miledi et al. ................. 436/180 |

FOREIGN PATENT DOCUMENTS

DE    19533291 A1    3/1996

OTHER PUBLICATIONS

Mann, "A Computer-Aided, Spatially-Selective Protection Technique for Multichip Module and Chip-On-Board Devices", Proc. 42nd Electronic Components and Technology Conference, IEEE, 1992, pp. 1046-1052. See "Description of the Encapsulation Technique, figure 4," Computer Controlled Dam Placement, figure 14.

* cited by examiner

Primary Examiner—Long K Tran
(74) Attorney, Agent, or Firm—Yingsheng Tung; Wade J. Brady, III; Frederick J. Telecky, Jr.

(57) ABSTRACT

The present invention provides a process for manufacturing an integrated circuit (IC) package and an integrated circuit (IC) package. The process, without limitation, includes providing an integrated circuit chip having a configuration, and forming a layer of overcoat material over the integrated circuit chip based upon the configuration.

14 Claims, 5 Drawing Sheets

US 7,648,857 B2

PROCESS FOR PRECISION PLACEMENT OF INTEGRATED CIRCUIT OVERCOAT MATERIAL

TECHNICAL FIELD OF THE INVENTION

The present invention is directed, in general, to a process for packaging an integrated circuit chip and, more specifically, to a process for precision placement of integrated circuit overcoat material and an integrated circuit package.

BACKGROUND OF THE INVENTION

In emerging technology markets, particularly analog markets, there is continual customer demand for higher precision products in smaller packages. To meet this demand, many mold encapsulated integrated circuit (IC) devices such op-amps, precision references, and other devices that contain packaging stress sensitive circuits require the use of die overcoat materials. The die overcoat materials are generally placed between the IC devices and the mold to prevent a shift in electrical characteristics, among other negative effects, that might be caused by packaging stress.

In a typical manufacturing process, the die overcoat material is deposited over the IC chip using a dropper containing a fluid form of the die overcoat material. For example, the dropper is generally used to deposit a thick layer of the die overcoat material over the entire IC chip. The large amount of die overcoat material dispensed upon the IC chip is chosen to assure that all the required sensitive circuitry is covered. Depositing the die overcoat material over the entire IC chip using the dropper has various drawbacks.

Accordingly, what is needed in the art is a process for placing die overcoat material, as well as other packaging materials, over IC circuitry that does not experience the drawbacks experienced by prior art processes.

SUMMARY OF THE INVENTION

To address the above-discussed deficiencies of the prior art, the present invention provides a process for manufacturing an integrated circuit (IC) package and an integrated circuit (IC) package. The process, without limitation, includes providing an integrated circuit chip having a configuration, and forming a layer of overcoat material over the integrated circuit chip based upon the configuration.

An integrated circuit package is also provided. The integrated circuit package, among other elements, may includes an integrated circuit chip, a layer of overcoat material located over less than an entire area of the integrated circuit chip, and a mold structure surrounding at least a portion of the integrated circuit chip and the layer of overcoat material.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
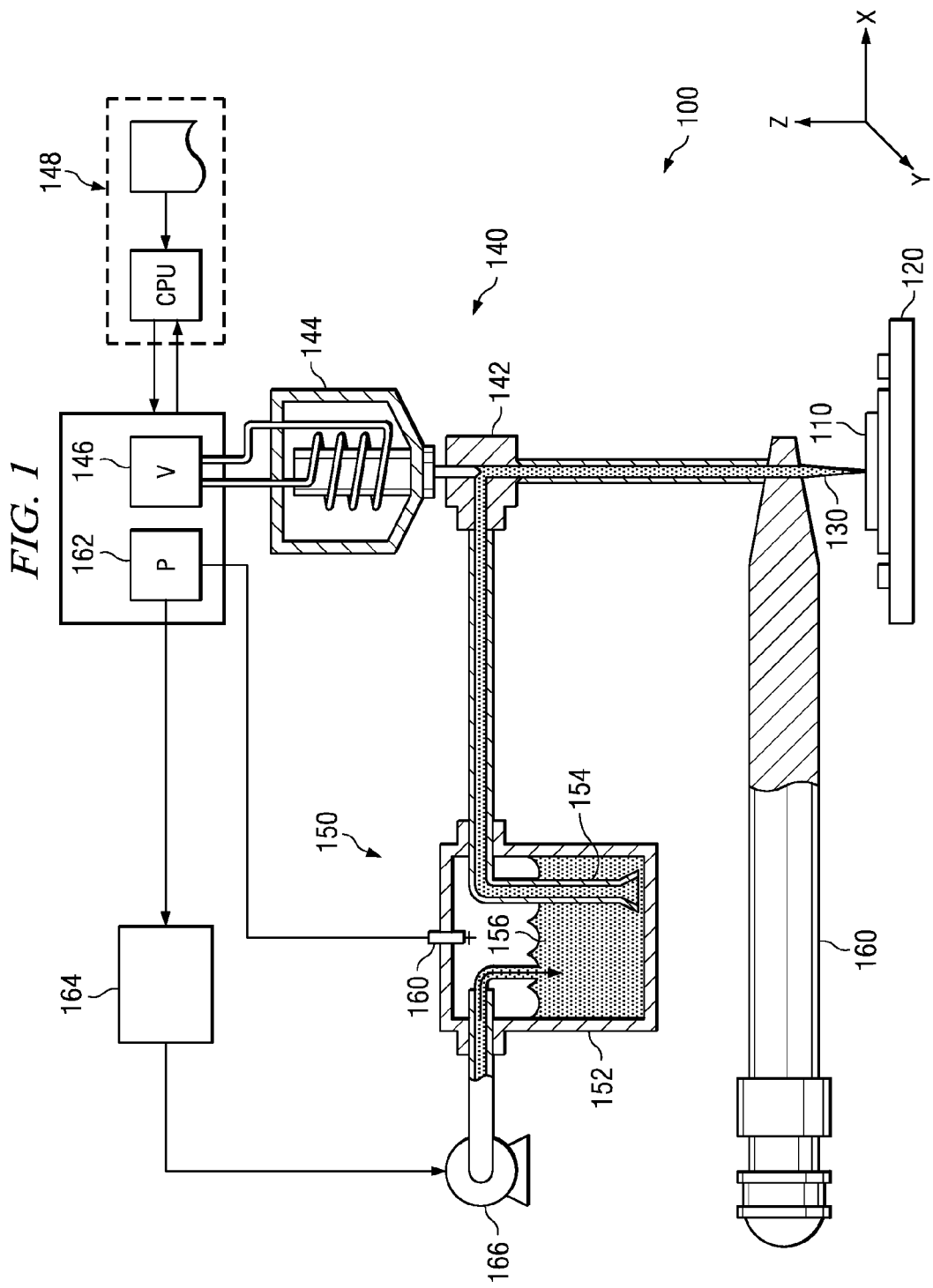
FIG. 1 illustrates a system for packaging an IC chip in accordance with the principles of the present invention.

The present invention is based, at least in part, on the acknowledgement that conventional processes used to deposit die overcoat materials lack the precision and thickness control needed by today's integrated circuit (IC) packages. More specifically, the present invention has acknowledged that the lack of precision and thickness control limits the industries' ability to employ die overcoat materials in certain thin, small outline packages. Moreover, the present invention has acknowledged that those IC packages that do employ the die overcoat material tend to suffer yield issues as a result of the insufficient precision and thickness control.

Based upon the foregoing acknowledgements, as well as substantial experimentation, the present invention recognizes that many of the aforementioned issues can be substantially reduced, if not substantially eliminated, by forming a layer of overcoat material over an IC chip based upon the configuration of the IC chip. The term configuration, as used herein, does not merely include the size or footprint of the IC chip, but must include other information. For example, the configuration of the IC chip might include the knowledge of regions of the IC chip that are pressure-sensitive or nonpressure-sensitive to mold stress. The configuration of the chip might also include the knowledge of the regions of the IC chip that are lowered or raised so as to require greater or lesser amounts of overcoat material, knowledge of regions of the IC chip that cannot come into contact with the layer of overcoat material for one reason or another, as well as any other information in addition to or apart from the size or footprint of the IC chip. Accordingly, it is this configuration that the layer of overcoat material is formed based upon.

The term overcoat material, as used herein, means any material positioned between the integrated circuit chip and the integrated circuit package, irrespective of its purpose. In certain instances, the overcoat material is a stress buffer layer positioned between the integrated circuit chip and the integrated circuit package. Nevertheless, other embodiments exist wherein the overcoat material has other purposes.

Moreover, after recognizing the benefits associated with forming the overcoat material based upon the configuration of the IC chip, the present invention further recognizes that selective and/or precision placement of the die overcoat material over the IC chip based upon the configuration would be beneficial. For example, the present invention recognizes that a capillary tube and XYZ stage could be used to literally draw the layer of overcoat material onto the surface of the IC chip exactly where it is needed, and no where else.

The present invention additionally recognizes that a conventional wire-bonding tool, in one instance an ABACUS wire bonding tool designed, marketed and sold through Texas Instruments, Inc. having its headquarters at 12500 TI Boulevard, Dallas, Tex. 75243, may be slightly modified to precisely dispense the layer of overcoat material on the IC chip. In this scenario, most of the functions that already exist within in the wire bonder system, those being vacuum control, solenoids, PC software interface, ultrasonic power controls, XYZ stage controllers and die mapping capabilities would continue to be used, and basically only the addition of components to provide dispensing control of the overcoat material would be needed. Moreover, because present wire bonders are already capable of pattern recognition to identify the four corner points in both the die and package coordinate system, it can be utilized and extended to include mapping information of selective overcoat chip areas. Such a modified system would offer far more capability than standard die overcoat systems that rely upon vacuum, plunger, or dot overcoat application methodologies.

Turning now to FIG. 1, illustrated is one embodiment of a system 100 for packaging an IC chip in accordance with the principles of the present invention. The packaging system 100 of FIG. 1 includes an IC chip 110 positioned on a bidirectional translatable table 120. In the illustrative embodiment, the bidirectional translatable table 120 includes an x-axis, as well as a y-axis normal to the x-axis. In the embodiment shown, the bidirectional translatable table 120 has a step resolution of at least about 50 mils. Nevertheless, in other embodiments the step resolution is at least about 1.0 mil, and at least about 0.1 mils, respectively. The 0.1 mil step resolution is similar to that found in an Abacus wire bonder, and would be considered very precise. In contrast to prior art packaging systems, the spatial control (e.g., step resolution) offered by the bidirectional translatable table 120 allows for the precise placement of a layer of overcoat material relative to the IC chip 110.

Positioned over the bidirectional translatable table 120 is a capillary tube 130. The capillary tube 130 is configured to dispense one or more components of an overcoat material on the IC chip 110. As might be expected, the capillary tube 130 may be configured to move toward and away from the IC chip 110 along a z-axis. As is illustrated, the capillary tube 130 is coupled to a regulated pressure source 150 via a valve system 140. The valve system 140, in the embodiment shown, includes a flow control valve body 142, a solenoid actuator 144, circuitry 146 for employing the solenoid actuator 144, and control software 148 for driving the circuitry 146.

The regulated pressure source 150, in the embodiment shown, includes a sealed tank 152, a pickup tube 154, and compressed fluid 156 (e.g., one or more components of the overcoat material). Coupled to the regulated pressure source 150 are a pressure sensor 160, flow control logic hardware 162, the control software 148, a regulator 164 and a regulated air compressor 166. Through the use of the bidirectional translatable table 120, valve system 140 and the regulated pressure source 150, one or more components of the overcoat material may be selectively delivered through the capillary tube 130 in small incremental volumes to the IC chip 110.

Additionally coupled to the capillary tube 130 is an ultrasonic device 160. The ultrasonic device 160, which in one embodiment is an ultrasonic horn or ultrasonic transducer, provides a mixing and spreading action, reducing the surface tension of the overcoat material on the IC chip 110. As compared to conventional methods, the ultrasonic device 160 allows a thinner overcoat layer to be deposited in more selective areas of the IC chip.

It should be noted that the system 100 of FIG. 1 is substantially similar to an Abacus wire bonder. In one scenario, the system 100 of FIG. 1 is an Abacus wire bonder having an add-on kit to accommodate the deposition of the layer of overcoat material. In another scenario, an additional head may be added to the Abacus wire bonder to accommodate the deposition of the layer of overcoat material. In this embodiment, both wire bonding and overcoat operations may be incorporated into a single in-line flow. In such a system, wire bonds would be made at one bond station, followed immediately by the dispensing and cure of the layer of overcoat material at a second station. Such a system would significantly lower costs by reducing floor space needs and add the flexibility to convert the wire bonder on a need-only basis.

Figure 2:
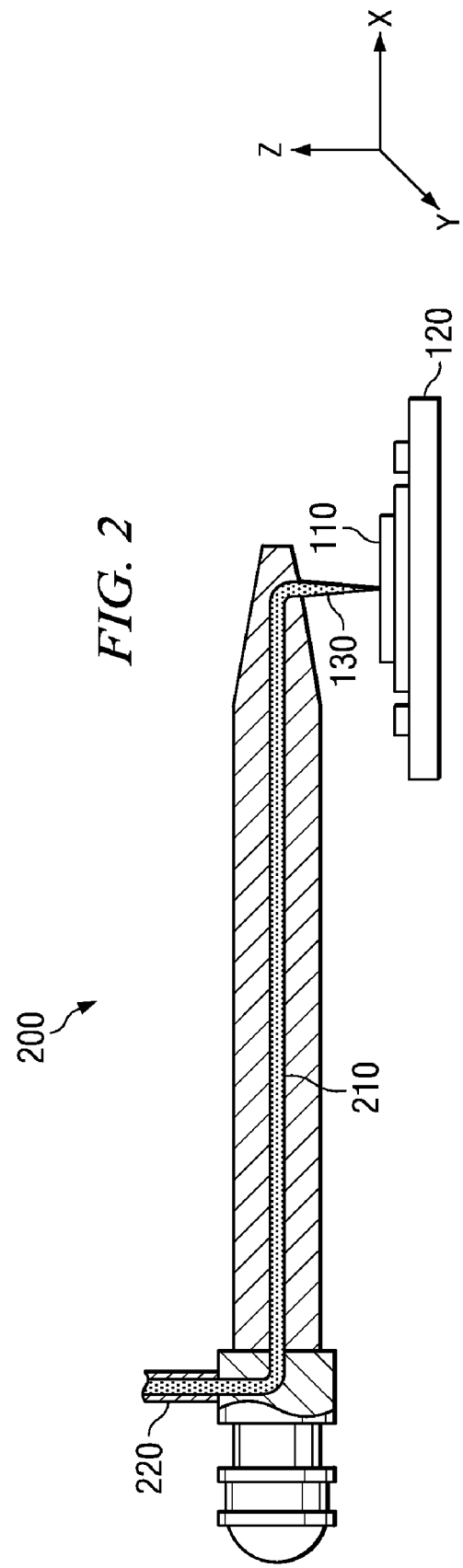
FIG. 2 illustrates an alternative embodiment of an ultrasonic device that might be used with the system of FIG. 1.

Turning briefly to FIG. 2, with continued reference to FIG. 1, illustrated is an alternative embodiment of an ultrasonic device 200, for example an ultrasonic horn, which might be used with the system 100 of FIG. 1. The ultrasonic device 200, as opposed to the ultrasonic device 100, has a capillary vein 210 bored down the centerline thereof, and also through one of the spokes 220 thereof. This configuration allows one or more components of the overcoat material to be delivered to the capillary 130 through the body of the ultrasonic device 200, and also allows the valve body 142 (FIG. 1) to be mounted in any suitable location. This specialized dispensing arrangement would likely provide superior ultrasonic action at the capillary 130, as external-tubing connections would not dampen the ultrasonic device 200 motion.

Figure 3:
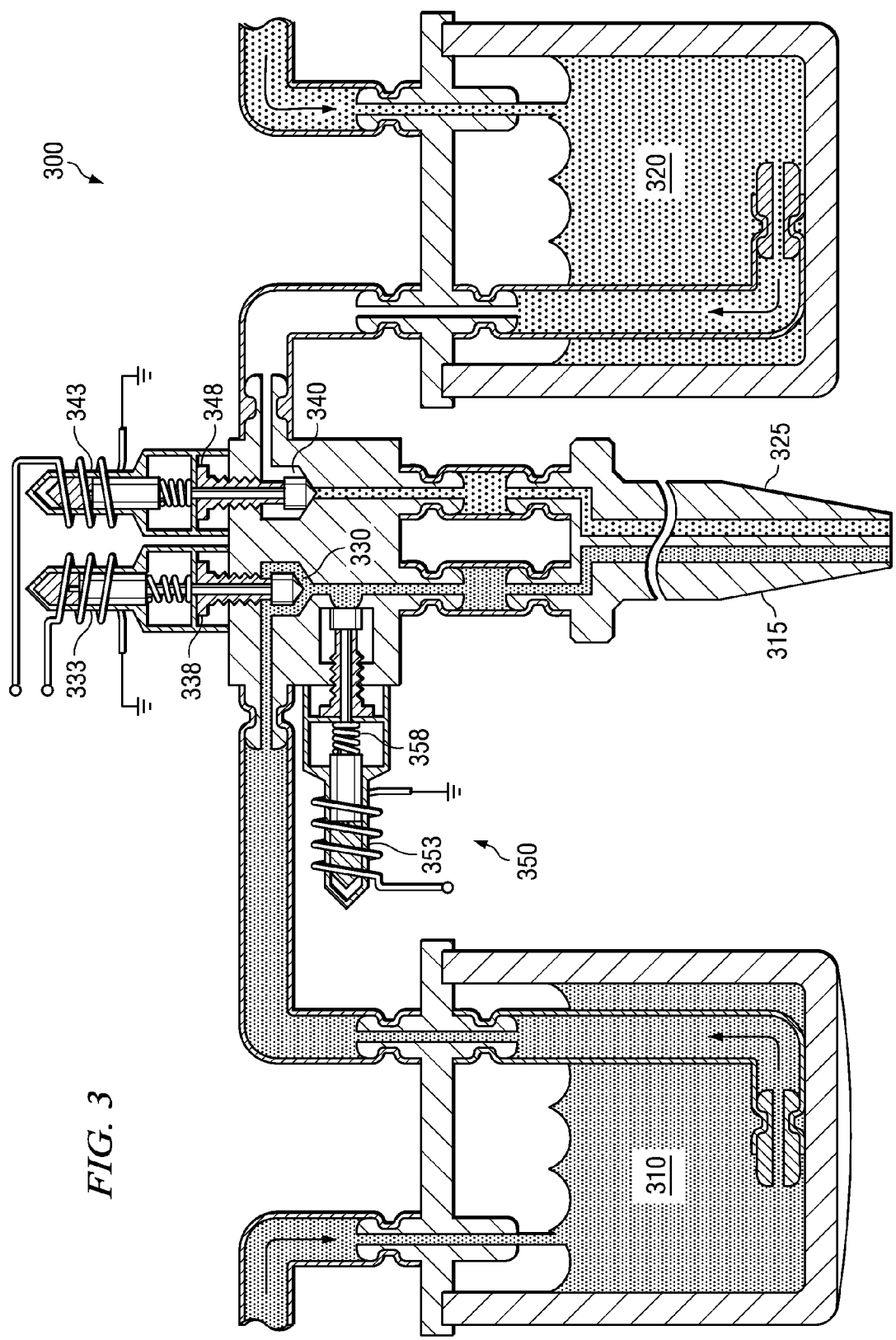
FIG. 3 illustrates an embodiment of a valve-controlled system that may separately deliver two or more components of an overcoat material to the surface of an IC chip.

Turning now to FIG. 3, illustrated is an embodiment of a valve-controlled system 300 that may separately deliver two or more components of an overcoat material to the surface of an IC chip in sufficiently small volumes to be surface mixed, for example by ultrasonic energy. FIG. 3 depicts that multiple pressurized fluid overcoat materials 310, 320 may be delivered to an IC surface through a multi-channel capillary 315, 325, respectively. In this embodiment, the flow and volume may be independently controlled by a set of inlet needle valves 330, 340 coupled to solenoid actuators 333, 343, respectively.

In one embodiment, output stages of a Pulse Width Modulator circuit, may be used to alternately drive the solenoid actuators 333, 343. In operation, the magnetic field established by the solenoid windings applies a force to solenoid cores with a tendency to center them within the windings, forcing the needle valves 330, 340 to a closed position. If the solenoid circuit is switched open, the magnetic field collapses and the needle valve return springs open the needle inlets, allowing the pressurized fluid to flow through the capillaries 315, 325. Additionally, flow adjustment screws 338, 348 allow control of maximum flow volume for differing viscosities, and set the travel of the inlet needle valve stroke.

If a Pulse Width Modulator circuit is used to control the needle valve solenoid actuators 333, 343, changing the frequency and duty cycle of the actuator signals may control both volume and mixing ratios. By alternately opening each needle valve 330, 340 for a suitably short time period, a mixing action may occur at the capillary orifice and further mixing will occur through the ultrasonic motion of the capillary tip. By matching the viscosity to the amount of ultrasonic power applied, the overflow may be determined and controlled resulting in lower finished heights and better overall coverage of an overcoat substance.

The valve control system 300 depicted in FIG. 3 further includes a fluid retractor piston 350 used to prevent fluid drip at the end of a deposition cycle. As the capillary 315, 325 is lifted from the IC chip surface, both flow needle valves 330, 340 are closed, and then the solenoid actuator circuit for the piston 353 is opened, allowing the piston to retract. The valve's return spring action 358 retracts the piston, which draws a small volume of fluid into the piston bore. The dispensed fluid is pulled away from the die surface back into the capillary 315, 325, reducing the possibility of a drip. The solenoid actuator circuit for the piston 353 is re-activated at the beginning of the next deposition cycle, forcing the fluid out of the piston bore.

Figure 4:
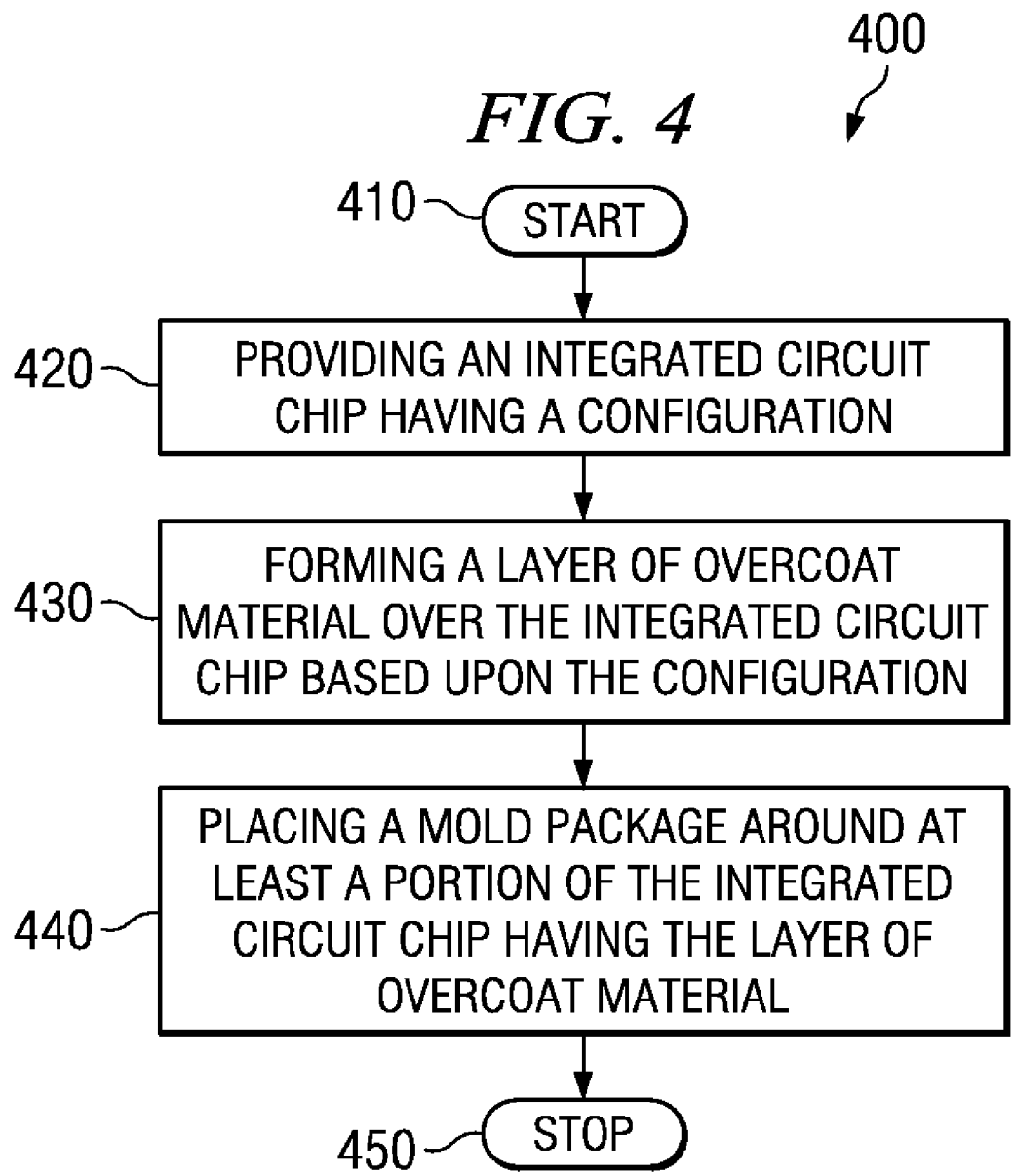
FIG. 4 illustrates a flow diagram illustrating how one might package an IC chip in accordance with the principles of the present invention.

Turning now to FIG. 4, illustrated is a flow diagram 400 illustrating how one might package an IC chip in accordance with the principles of the present invention. The flow diagram 400 of FIG. 4 begins in a start step 410. Thereafter, in a step 420, an IC chip having a configuration may be provided. The IC chip may be any of many different chips. Nevertheless, thin, small outline IC chips benefit greatly from using the inventive aspects of the present invention. For example, thin IC chips, supporting IC packages having a thickness of about 175 microns or less could be used, whereas prior art usefulness is limited by the dome height of the overcoat material to use in packages of about 1200 microns thickness or more. Similarly, IC chips having a footprint area of about 30 square mils or less, or alternatively a footprint area ranging from about 10 square mils to about 20 square mils, could be used. The present invention benefits IC chips having such thicknesses and footprint areas due to the need to have more precision and thickness control of the overcoat material with those IC chips.

In addition to size and thickness, the IC chip may include many different regions of circuitry. In one embodiment, the IC chip includes a first region comprising pressure-sensitive features and a second region comprising nonpressure-sensitive regions. For instance, the IC chip in this embodiment might include op-amps, precision references, and other circuitry that contains packaging stress sensitive features, among others, as well as other circuitry that does not contain packaging stress sensitive features. The IC chip may, in another embodiment, further include raised and lowered regions constituting different features (e.g., circuitry) on the IC chip itself.

In addition to the different thicknesses, sizes, regions and amounts of circuitry that the IC chip may comprise, the IC chip provided in step 420 may be at various different stages of manufacture. In one embodiment, the IC chip provided in step 420 is substantially complete, including already being wire bonded, and is awaiting the steps of applying the overcoat material and placing a mold package thereover. In an alternative embodiment, however, the IC chip provided in step 420 is at an earlier stage of manufacture. For instance, the IC chip provided in step 420 might be substantially complete but for the wire bonding and subsequent steps, or alternatively at an even earlier stage of manufacture.

After providing the IC chip in step 420, a layer of overcoat material may be formed over the IC chip based upon a configuration of the IC chip, in a step 430. As those skilled in the art appreciate, a system similar to the system 100 described with respect to FIG. 1 might be used to form the layer of overcoat material. Accordingly, a bidirectional translatable table, capillary tube, and the associated valve system, regulated pressure source, and ultrasonic device, could be used to selectively and precisely deliver small incremental volumes of overcoat material to the IC chip. Moreover, pattern recognition could be used to identify the four corner points in both the die and package coordinate system, and furthermore it can be extended to include mapping information of selective overcoat chip areas.

Nevertheless, in those embodiments wherein the IC chip provided has first and second regions (e.g., pressure-sensitive regions and nonpressure-sensitive regions, raised and lowered regions, etc.), the layer of overcoat material may be formed over the IC chip based upon the first and second regions. In another embodiment, and based upon the configuration, the layer of overcoat material may be formed substantially over the first region, while leaving the second region substantially uncovered.

Figure 5:
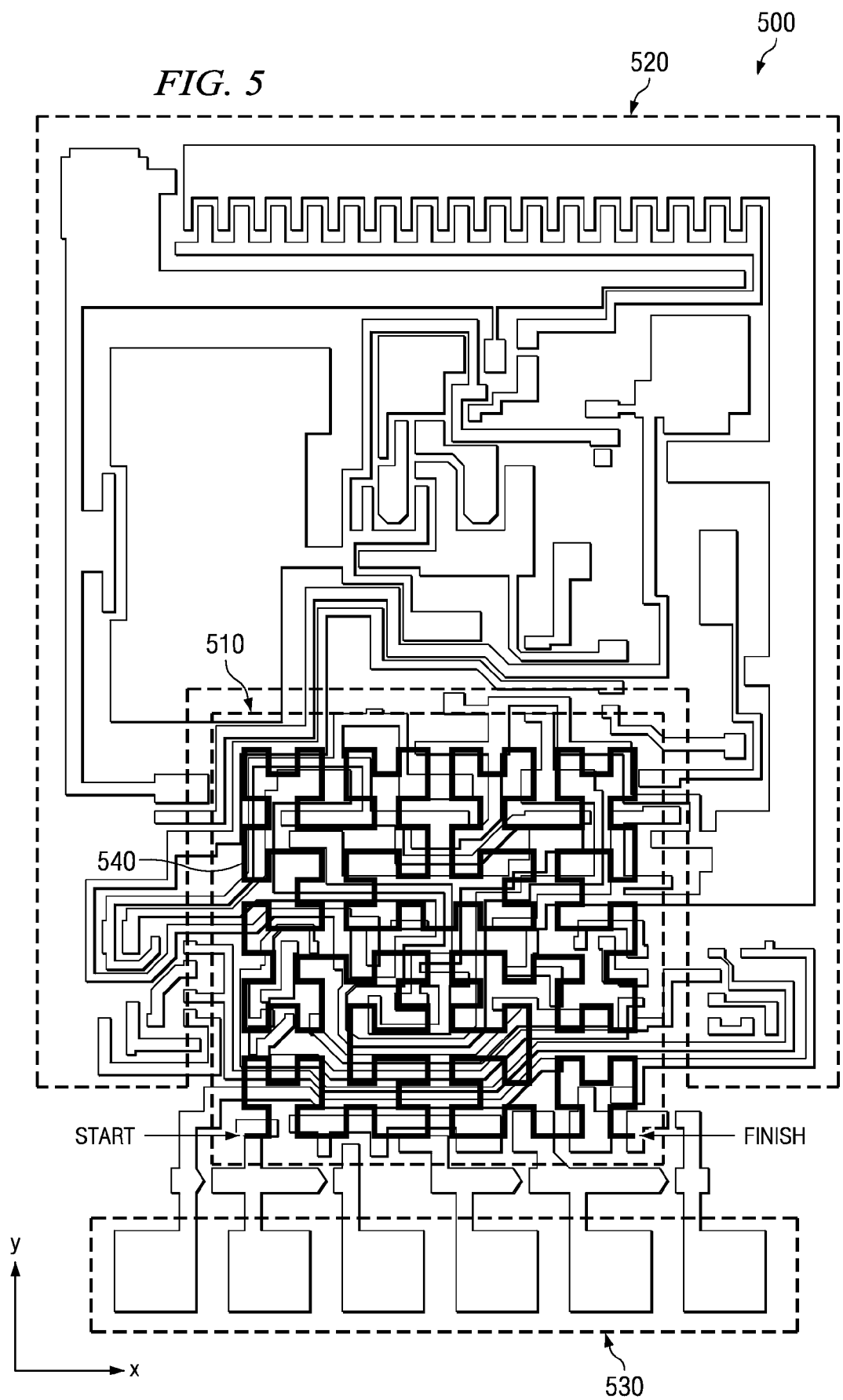
FIG. 5 illustrates an embodiment of dispensing overcoat material over precise locations of an IC chip.

Turning briefly to FIG. 5, illustrated is an embodiment of dispensing overcoat material over precise locations of an IC chip. FIG. 5 represents a plan view of an IC chip 500. The IC chip 500 of FIG. 5 includes a first region 510, a second region 520, and a third region 530. In the embodiment shown, the first region 510 includes pressure-sensitive circuitry, the second region 520 includes nonpressure-sensitive circuitry and the third region 530 includes bond pads (e.g., additional nonpressure-sensitive circuitry). FIG. 5 illustrates that a layer of overcoat material 540 may be formed substantially over the first region 510, while leaving the second and third regions 520, 530 substantially uncovered.

In one embodiment, a capillary tube could be used to dispense one or more components of the overcoat material along a path over the first region 510. For example, the capillary tube and a bidirectional translatable table could be used to dispense one or more components of the overcoat material along a geometric path over the first region 510. It is suggested that well known Peano fractal algorithms, such as the plane filling Hilbert Curve depicted in FIG. 5, may be programmed to drive the bidirectional translatable table motion as the controlled flow of the overcoat material is dispensed over the IC chip surface.

When the layer of overcoat material is dispensed in such a path, an ultrasonic device and/or gravity may be used to cause the path of overcoat material to spread and thus form a layer of overcoat material. Ultimately, it is desired for the critical areas (e.g., the first region 510) of the IC chip 500 to be sufficiently protected from mold stress by the selectively applied overcoat, while the non-critical areas (e.g., the second and third regions 520, 530) are not.

Returning to FIG. 4, in a step 440 a mold package may be placed around at least a portion of the IC chip having the layer of overcoat material thereover. Those skilled in the art understand the process for placing the mold package around the IC chip having the layer of overcoat material thereover. Thereafter, the process for packaging an IC chip in accordance with the principles of the present invention will return to step 420, or alternatively will terminate in a stop step 450.

The present invention, whether it be the system for dispensing the layer of overcoat material or the process for dispensing the layer of overcoat material includes many benefits over traditional systems and processes. For Example, as compared to conventional systems and processes, the described system significantly increases the ability to control the volume and placement of dispensed materials to an IC surface, allows substantial improvement in dispensed pattern resolution, and is similar in ball placement accuracy now found in state-of-the-art wire bond equipment (approximately 0.1 mil). These improvements result in lower material costs, improved repeatability in device assembly, and increased product yield.

Moreover, the inclusion of the ultrasonic device into the system allows the surface tension of the overcoat material to be controlled during the application thereof. With this control, the finished height of the overcoat material can be reduced by altering the surface tension, resulting in the ability to use the process in smaller packages and extend product offerings. Moreover, the ultrasonic device provides the ability for on-surface mixing. This offers the possibility of expanding the art by using more advanced materials with superior characteristics. These, as well as others, are a few of the benefits of the inventive system and process of the present invention.

Those skilled in the art to which the invention relates will appreciate that other and further additions, deletions, substitutions and modifications may be made to the described embodiments without departing from the scope of the invention.

What is claimed is:

1. A process for packaging an integrated circuit chip, comprising:

placing an integrated circuit chip having a configuration on a bidirectional translatable table;

stepping the chip relative to a dispenser; and dispensing an overcoat material from the dispenser over the integrated circuit chip along a path corresponding to the stepping and based upon the configuration.

2. The process as recited in claim 1 wherein dispensing an overcoat material includes forming the layer of overcoat material only upon a first portion of the chip.

3. The process as recited in claim 2 wherein the first portion is pressure-sensitive.

4. The process as recited in claim 1 wherein the path is a geometric path.

5. The process as recited in claim 4 wherein the geometric path is a plane-filling curve.

6. The process as recited in claim 1 wherein the dispenser is a capillary tube.

7. The process as recited in claim 6 wherein the capillary tube simultaneously dispenses two or more components of the overcoat material along the path.

8. The process as recited in claim 1 wherein the bidirectional translatable table comprises an X-axis normal to a Y-axis, and further wherein the table has a step resolution of at least about 50 mils.

9. The process as recited in claim 8 wherein the table has a step resolution of at least about 1.0 mil.

10. The process as recited in claim 1 further comprising using an ultrasonic device configured to reduce a surface tension of the overcoat material.

11. The process as recited in claim 10 further comprising passing the overcoat material through an opening in the ultrasonic device.

12. The process as recited in claim 1, further including forming wire bonds on the integrated circuit chip prior to dispensing the overcoat material.

13. The process as recited in claim 12 wherein a single multi-station device forms the wire bonds and layer of overcoat material.

14. The process as recited in claim 1, further including forming a mold structure surrounding at least a portion of the integrated circuit chip.

* * * * *

UNITED STATES PATENT AND TRADEMARK OFFICE
CERTIFICATE OF CORRECTION

PATENT NO.      : 7,648,857 B2                                    Page 1 of 1
APPLICATION NO. : 11/464080
DATED           : January 19, 2010
INVENTOR(S)     : Malolepszy et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 324 days.

Signed and Sealed this

Twenty-eighth Day of December, 2010

David J. Kappos
*Director of the United States Patent and Trademark Office*